US010367110B2

(12) United States Patent
Jin et al.

(10) Patent No.: US 10,367,110 B2
(45) Date of Patent: Jul. 30, 2019

(54) PHOTOVOLTAIC DEVICES AND METHOD OF MANUFACTURING

(71) Applicant: First Solar, Inc., Tempe, AZ (US)

(72) Inventors: Changming Jin, Perrysburg, OH (US); Sanghyun Lee, Perrysburg, OH (US); Jun-Ying Zhang, Perrysburg, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 15/373,228

(22) Filed: Dec. 8, 2016

(65) Prior Publication Data

US 2017/0170353 A1 Jun. 15, 2017

Related U.S. Application Data

(60) Provisional application No. 62/265,121, filed on Dec. 9, 2015.

(51) Int. Cl.
*H01L 31/18* (2006.01)
*H01L 31/073* (2012.01)
(Continued)

(52) U.S. Cl.
CPC ........ *H01L 31/073* (2013.01); *H01L 31/0264* (2013.01); *H01L 31/0272* (2013.01); *H01L 31/1868* (2013.01); *H01J 2237/335* (2013.01); *H01L 21/02422* (2013.01); *H01L 21/02491* (2013.01); *H01L 21/02551* (2013.01);
(Continued)

(58) Field of Classification Search
CPC ............. H01L 31/0272; H01L 31/0264; H01L 31/073; H01L 31/18; H01L 31/1828; H01L 21/02315; H01L 21/02301; H01L 21/02661; H01L 2224/80013; H01L 2224/80913; H01L 2224/81013; H01L 2224/81913; H01L 2224/83013; H01L 2224/83913; H01L 2224/84013;
(Continued)

(56) References Cited

U.S. PATENT DOCUMENTS 3,496,024 A * 2/1970 Ruehrwein ............. C30B 25/02
136/252
5,064,477 A * 11/1991 Delahoy ......... H01L 31/022466
136/256
(Continued)

FOREIGN PATENT DOCUMENTS

EP         1160880 A2   12/2001
WO     2014077895 A1    5/2014

OTHER PUBLICATIONS

Rose, D.H., "The Effect of Oxygen on CdTe-Absorber Solar Cells Deposited by Close-Spaced Sublimation", Thesis, 1997, University of Colorado, Department of Electrical and Computer Engineering.
(Continued)

*Primary Examiner* — Earl N Taylor
(74) *Attorney, Agent, or Firm* — MacMillan, Sobanski & Todd, LLC

(57) ABSTRACT

Disclosed are methods for the surface cleaning and passivation of PV absorbers, such as CdTe substrates usable in solar cells, and devices made by such methods. In some embodiments, the method involves an anode layer ion source (ALIS) plasma discharge process to clean and oxidize a CdTe surface to produce a thin oxide layer between the CdTe layer and subsequent back contact layer(s).

23 Claims, 7 Drawing Sheets

(51) Int. Cl.
  *H01L 31/0264* (2006.01)
  *H01L 31/0272* (2006.01)
  *H01L 21/02* (2006.01)

(52) U.S. Cl.
  CPC ....... *H01L 21/02664* (2013.01); *Y02E 10/543* (2013.01); *Y02P 70/521* (2015.11)

(58) Field of Classification Search
  CPC . H01L 2224/84913; H01L 2224/85013; H01L 2224/85913
  See application file for complete search history.

(56) References Cited

U.S. PATENT DOCUMENTS

| | | | |
|---|---|---|---|
| 5,393,675 A | 2/1995 | Compaan | |
| 5,563,092 A * | 10/1996 | Ohmi | H01L 21/02381 118/723 E |
| 5,827,773 A * | 10/1998 | Voutsas | G02F 1/13454 438/488 |
| 6,140,570 A * | 10/2000 | Kariya | H01L 31/022466 136/246 |
| 6,169,013 B1 * | 1/2001 | Voutsas | G02F 1/13454 257/E21.133 |
| 6,329,270 B1 * | 12/2001 | Voutsas | G02F 1/13454 257/E21.133 |
| 6,423,565 B1 | 7/2002 | Barth et al. | |
| 7,919,400 B2 * | 4/2011 | Lee | B82Y 30/00 438/510 |
| 8,203,071 B2 * | 6/2012 | Sheng | H01L 31/03685 136/255 |
| 8,431,427 B2 * | 4/2013 | Gloeckler | H01L 31/048 438/64 |
| 8,497,151 B2 | 7/2013 | Xiong et al. | |
| 8,525,021 B2 * | 9/2013 | Eaglesham | H01L 31/072 136/252 |
| 8,603,253 B2 * | 12/2013 | Addepalli | C11D 3/2075 134/1.3 |
| 8,741,687 B2 * | 6/2014 | Zhao | H01L 31/022466 136/244 |
| 8,748,214 B2 * | 6/2014 | DeLuca | H01L 31/02963 257/E21.07 |
| 8,785,232 B2 | 7/2014 | Xiong et al. | |
| 8,821,964 B1 * | 9/2014 | Huang | H01L 31/032 427/74 |
| 8,912,037 B2 * | 12/2014 | Johnson | H01L 31/1836 257/E31.018 |
| 9,450,115 B2 * | 9/2016 | Christensen | H01L 31/022425 |
| 9,461,186 B2 * | 10/2016 | Jayaraman | H01L 31/022425 |
| 2001/0024853 A1 * | 9/2001 | Wallace | H01L 21/28167 438/240 |
| 2002/0000370 A1 * | 1/2002 | Pommer | C23C 14/022 204/192.14 |
| 2003/0015965 A1 * | 1/2003 | Godyak | H01J 37/32009 315/111.21 |
| 2004/0107909 A1 * | 6/2004 | Collins | H01J 37/32082 118/723 I |
| 2004/0149218 A1 * | 8/2004 | Collins | H01J 37/32082 118/723 I |
| 2005/0051272 A1 * | 3/2005 | Collins | H01J 37/32082 156/345.48 |
| 2005/0158891 A1 * | 7/2005 | Barth | H01L 31/1828 438/22 |
| 2006/0177599 A1 * | 8/2006 | Madocks | C23C 14/32 427/569 |
| 2008/0115827 A1 * | 5/2008 | Woods | H01L 31/0392 136/255 |
| 2009/0017605 A1 * | 1/2009 | Lee | B82Y 30/00 438/558 |
| 2009/0035586 A1 * | 2/2009 | Cangemi | B08B 3/12 428/446 |
| 2009/0078318 A1 | 3/2009 | Meyers et al. | |
| 2009/0194505 A1 * | 8/2009 | Slafer | C23C 14/022 216/59 |
| 2009/0255578 A1 * | 10/2009 | Eaglesham | H01L 31/022466 136/256 |
| 2010/0029067 A1 * | 2/2010 | Vijh | C23C 14/562 438/478 |
| 2010/0288359 A1 * | 11/2010 | Xiong | H01L 31/02963 136/261 |
| 2010/0294024 A1 * | 11/2010 | Kumar | B82Y 20/00 73/38 |
| 2010/0311203 A1 | 12/2010 | Borden et al. | |
| 2011/0030991 A1 * | 2/2011 | Veerasamy | C30B 29/02 174/126.1 |
| 2011/0061736 A1 * | 3/2011 | Addepalli | C11D 3/2075 136/260 |
| 2011/0088763 A1 * | 4/2011 | Le | H01L 31/03762 136/255 |
| 2011/0189806 A1 * | 8/2011 | Cao | C23C 14/086 438/62 |
| 2011/0309477 A1 * | 12/2011 | Kimball | H01L 31/032 257/613 |
| 2012/0285522 A1 * | 11/2012 | Sommer | H01L 31/022466 136/255 |
| 2012/0325298 A1 * | 12/2012 | Johnson | C23C 18/1204 136/255 |
| 2013/0102133 A1 * | 4/2013 | Sheng | H01L 21/0257 438/478 |
| 2013/0139878 A1 * | 6/2013 | Bhatnagar | H01L 31/022466 136/256 |
| 2014/0060608 A1 * | 3/2014 | Choi | H01L 31/022425 136/244 |
| 2014/0213016 A1 * | 7/2014 | Sheng | H01L 31/02167 438/97 |
| 2014/0216550 A1 * | 8/2014 | Damjanovic | H01L 31/02966 136/260 |
| 2014/0273334 A1 * | 9/2014 | Christensen | H01L 31/022425 438/94 |
| 2014/0273407 A1 * | 9/2014 | Christensen | H01L 31/1868 438/476 |
| 2015/0111335 A1 * | 4/2015 | Granata | H01L 31/0392 438/73 |
| 2016/0040912 A1 * | 2/2016 | Chandra | C23C 14/022 428/216 |
| 2016/0141192 A1 * | 5/2016 | Uneyama | G01N 21/78 116/201 |
| 2017/0052294 A1 * | 2/2017 | Cangemi | G02B 7/025 |
| 2017/0170353 A1 * | 6/2017 | Jin | H01L 31/073 |

OTHER PUBLICATIONS

International Search Report and Written Opinion, Application No. PCT/US2015/015387, dated Jun. 23, 2015.
Dudnikov et al.; "Ion Source With Closed Drift Anode Layer Plasma Acceleration", Review of Scientific Instruments, AIP, Melville, NY, US; vol. 73, No. 2; Feb. 1, 2002, pp. 729-731.
International Search Report, PCT/US2016/065511, dated Jun. 18, 2017.
International Preliminary Report on Patentability and Written Opinion, PCT/US2016/065511, dated Jun. 12, 2018.
Krishnamurthy, et al: "Oxide Interfacial Layers in AU Ohmic Contacts to P-Type HG1-XCDX TE", Applied Physics Letters, A I P Publishing LLC, US, vol. 56, No. 10, Mar. 5, 1990, pp. 925-927.
Viswanathan et al.; "RF Sputter Etch as a Surface Cleaning Process for DeTe Solar Cells", Conference Record of the Thirty-First IEEE Photovoltaic Specialist Conference (IEEE Cat. No. 05CH37608) IEEE Piscataway, NJ, USA, IEEE; Jan. 3, 2015, pp. 426-429.

* cited by examiner

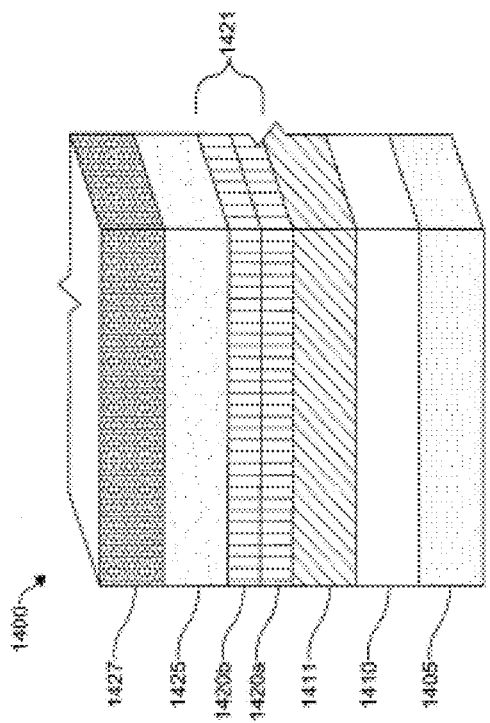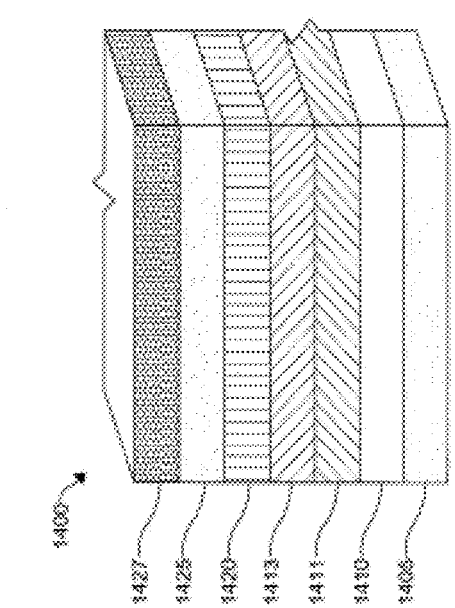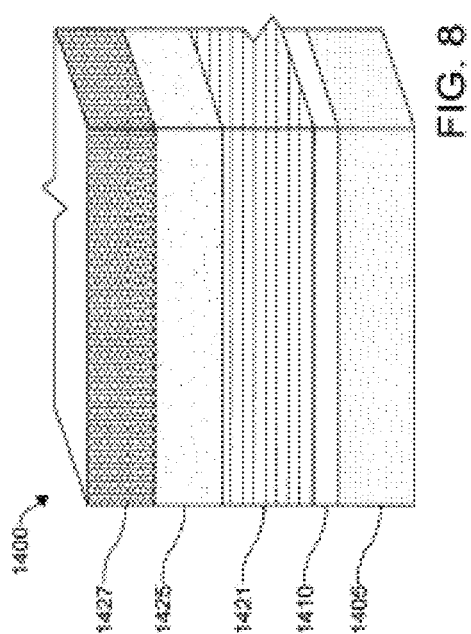

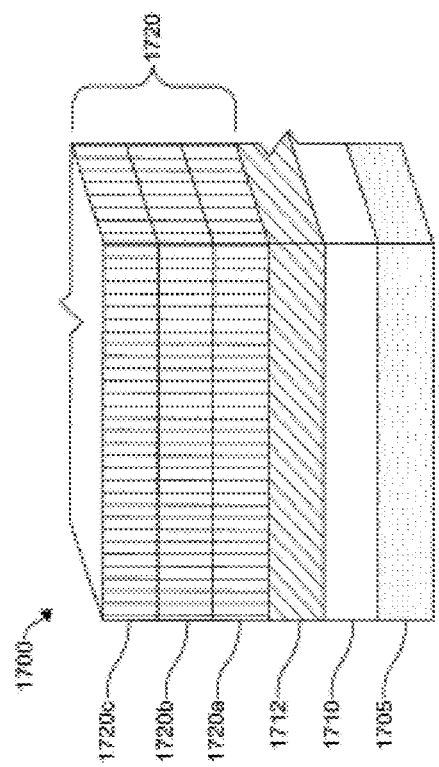
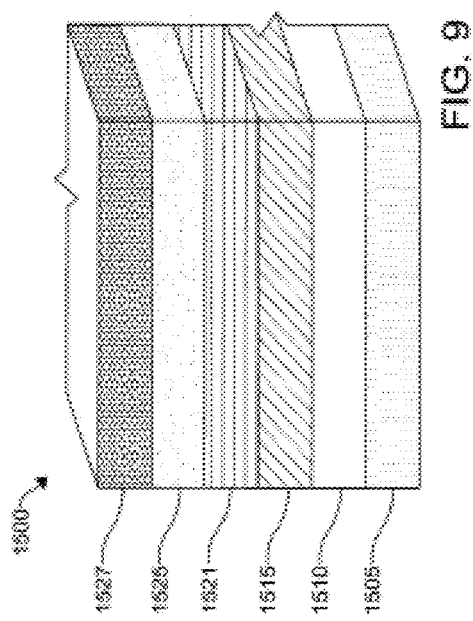
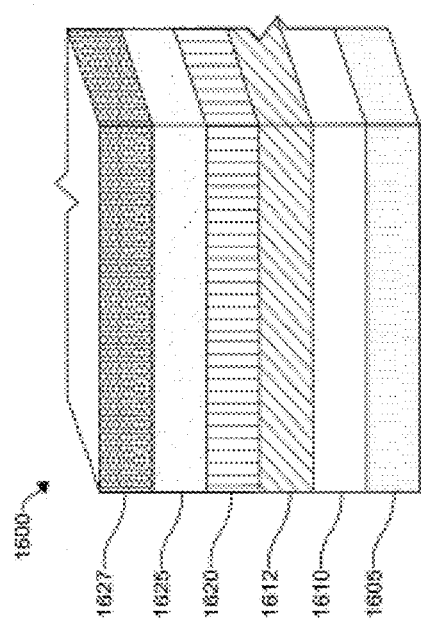

PHOTOVOLTAIC DEVICES AND METHOD OF MANUFACTURING

FIELD

The present invention relates to the field of surface cleaning and passivating semiconductor materials, such as CdTe, usable in photovoltaic devices.

BACKGROUND

A photovoltaic structure generates electrical power by converting light into direct current electricity using semiconductor materials that exhibit the photovoltaic effect. The photovoltaic effect generates electrical power upon exposure to light as photons, packets of energy, are absorbed within the semiconductor material to excite electrons to a higher energy state, leaving behind an empty state ("hole"). These excited electrons and holes are thus able to conduct and move freely within the material.

A basic unit of photovoltaic structure, commonly called a cell, may generate only small scale electrical power. Thus, multiple cells may be electrically connected to aggregate the total power generated among the multiple cells within a larger integrated device, called a module, or a panel. A photovoltaic module may further comprise a protective back layer and encapsulant materials to protect the included cells from environmental factors. Multiple photovoltaic modules or panels can be assembled together to create a photovoltaic system, or array, capable of generating significant electrical power up to levels comparable to other types of utility-scale power plants. In addition to photovoltaic modules, a utility-scale array would further include mounting structures, electrical equipment including inverters, transformers, and other control systems. Considering various levels of device, from individual cell to utility-scale arrays containing a multitude of modules, all such implementations of the photovoltaic effect may contain one or more photovoltaic structures to accomplish the energy conversion.

To generate power from sunlight, the active area of a photovoltaic structure or device generally includes a junction of two distinct regions, one above the other and each containing one or more materials, where each material may further contain added impurities. The result is that one region in the photovoltaic device is n-type, having an excess of negatively charged electrons, while the other is p-type, having an excess of positively charged holes. In typical CdS/CdTe solar cells, these regions are commonly named the window layer, for the n-type CdS region, and the absorber layer, for the p-type CdTe region. These regions may be made of different materials, doped or not; or of the same material with dopants to create the p-type and n-type regions. Where these two regions abut one another, a p-n junction is formed. The window layer is preferred to be as thin as possible in order to allow the maximum amount of light to reach the absorber layer, yet it also needs to be sufficiently thick to maintain a robust p-n junction with the absorber layer and prevent shunting.

When photons create free electrons and holes, collectively called charge carriers, near the p-n junction, the internal electric field of the junction causes the electrons to move towards the n side of the junction and the holes towards the p side thereby generating an electrical charge potential. A front contact, electrically connected to the window layer, and a back contact, electrically connected to the absorber layer can provide pathways through which the electrical charge potential can flow to become an electrical current. Electrons can flow back to the p-side via an external current path, or circuit.

While moving within the semiconductor materials, the mobile electrons and holes may recombine—which reduces the total number of charge carriers available to generate current flow within the device and reduces the overall conversion efficiency. Efficiency refers to the electrical power or energy generated by the PV device compared to the equivalent energy of photons incident on the device. A key objective for manufacturing photovoltaic devices is to increase actual efficiencies obtained, to approximate the maximum or "entitlement" conversion efficiency.

An important issue in CdTe solar cell technology is the formation of an efficient and stable ohmic contact on the p-CdTe layer. But an ohmic contact on a p-type semiconductor is difficult to achieve for two main reasons: (1) because the crystalline structure and manufacturing processes of the absorber may leave a surface that is not completely compatible with a metal contact; and (2) because the work function of the metal contact should be higher that of the semiconductor material or a Schottky barrier may be formed. Prior to depositing or forming the back contact layer on the semiconductor layer of a photovoltaic device, it may be desirable to remove surface contamination from the semiconductor layer. Surface contamination includes oxidation of the semiconductor layer, adsorption of hydrocarbon and/or carbonates and/or other organic and inorganic contaminants on the semiconductor layer, for example. Contaminants formed on the semiconductor layer may adversely affect the interface between the semiconductor layer and the back contact layer. A poor interface between the semiconductor layer and the back contact layer may have an undesirable effect on the photovoltaic device, and specifically on $V_{oc}$ and $R_{oc}$. Known methods of removing contaminants from the surface of the semiconductor layer may negatively affect grain boundaries and/or lattice structure of the crystals forming the semiconductor layer. It would be desirable to develop a more effective method to remove surface contaminants from a semiconductor layer and a photovoltaic device prior to depositing or forming a back contact layer to improve a performance of the photovoltaic device.

To avoid a Schottky barrier against a p-type CdTe absorber layer, a metal with a work function higher than 5.7 eV is needed, but metals having such high work functions are not readily available. To overcome this problem, a heavily doped p-CdTe surface is created with the help of chemical etching and a buffer layer of high carrier concentration is often applied. Subsequent post-deposition annealing diffuses some buffer material into the CdTe, where it changes the band edges as a result of change in the interface state density. The result is a lowering in interface barrier height and width, which enables a quasi-ohmic or tunneling contact between the metal and CdTe. Commonly used buffer layer/metallization combinations are Cu/Au, Cu/graphite, or graphite pastes doped with Hg and Cu. However, back-contacts containing Cu or other metal dopants are often not stable with time because the metals may diffuse or migrate from the back-contact to the CdTe layer, thereby causing degradation. Thus, there is a need to provide improved back contact layers to provide better interfaces, to minimize recombination of electron/hole pairs at the back contact, and to provide the desired power conversion efficiencies to make cost effective photovoltaic devices.

Therefore, it is desirable to provide an efficient p-n junction between layers of semiconductor materials, incorporating an absorber layer that can be cleaned and passivated, thereby increasing ohmic stability and efficiency.

DESCRIPTION OF THE DRAWINGS

The above, as well as other advantages of the present invention, will become readily apparent to those skilled in the art from the following detailed description of a preferred embodiment when considered in the light of the accompanying drawings in which:

FIGS. 3 to 11 depict schematics of functional layers in a photovoltaic device according to various embodiments with different semiconductor stack variations;

DETAILED DESCRIPTION

Figure 1:
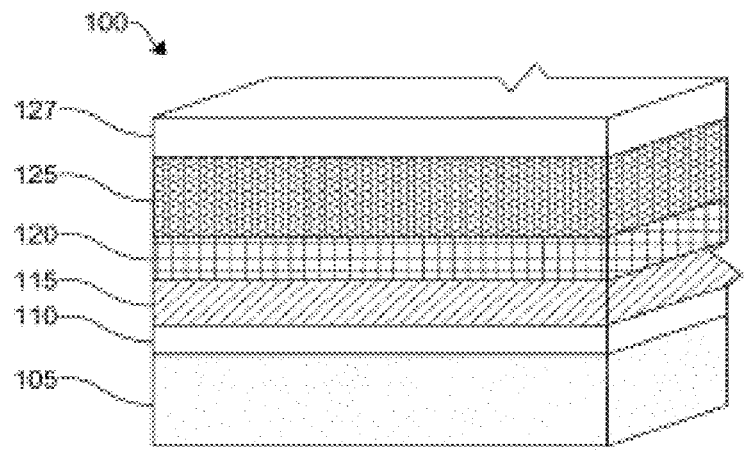
FIG. 1 depicts a schematic of functional layers in a photovoltaic device according to an embodiment of the invention.

The following detailed description and appended drawings describe and illustrate various exemplary embodiments of the invention. The description and drawings serve to enable one skilled in the art to make and use the invention and are not intended to limit the scope of the invention in any manner. In respect of the methods disclosed, the steps presented are exemplary in nature and, thus, the order of the steps is not necessary or critical.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless a context of mutual exclusivity clearly dictates otherwise.

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, the preferred methods and materials are described herein.

Numerical ranges, measurements and parameters used to characterize the invention—for example, angular degrees, quantities of ingredients, polymer molecular weights, reaction conditions (pH, temperatures, charge levels, etc.), physical dimensions and so forth—are necessarily approximations; and, while reported as precisely as possible, they inherently contain imprecision derived from their respective measurements. Consequently, all numbers expressing ranges of magnitudes as used in the specification and claims are to be understood as being modified in all instances by the term "about." All numerical ranges are understood to include all possible incremental sub-ranges within the outer boundaries of the range. Thus, a range of 30 to 90 units discloses, for example, 35 to 50 units, 45 to 85 units, and 40 to 80 units, etc.

The term "transparent" as used herein in the context of a semiconductor layer refers to material that allows an average transmission of at least 70% of incident electromagnetic radiation having a wavelength in a range from about 300 nm to about 1000 nm.

As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

The term "atomic concentration" as used in this context herein refers to the average number of atoms per unit volume of the absorber layer. The terms "atomic percent" or "at %" refer to the ratio of the number of a particular atom to the total number of like atoms (cation or anion). Using cadmium, selenium, and tellurium as a ternary example, atomic percent may be represented in a decimal format by "x" in the formula notation: $CdSe_xTe_{1-x}$; wherein x may range, for example, from 0.1 to 0.40 (i.e. from 1-40%).

A layer is said to be "stoichiometric" then the ions are in the proper chemical ratio for the desired absorber formulation. For example, for a GaAs absorber the ratio of gallium to arsenic should be 1:1 without additional Ga or As ions in the crystalline structure. For a CdTe absorber, the ratio of cadmium to tellurium should be 1:1 without additional Cd or Te ions present in the crystalline structure.

Photovoltaic Devices

Photovoltaic devices generally comprise multiple layers of various materials, for example an front contact layer stack, a semiconductor layer stack and a back contact layer stack, each layer "stack" comprising from 1 to 8 layers, such as from 1 to 5 layers, or from 1 to 4 layers. FIG. 1 depicts a photovoltaic device 100 according to the invention wherein a number of layers are shown generally and described herein. The layers that are described herein, the materials used to form the layers, and/or the methods of forming the layers of the photovoltaic device 100 may be substituted, included in addition to layers described, or be absent in the embodiments of the invention described herein below and illustrated in the figures. Several specific embodiments of a novel photovoltaic device will be described with reference to the figures. It is further understood that each of the layers may be deposited in a single layer deposition from a single material, from a multi-layer deposition from a single material, or from a multi-layer deposition from a plurality of materials, as desired.

The photovoltaic device 100 may include a "front contact layer stack", which includes a substrate layer 105, a transparent conductive oxide (TCO) layer 110; a "semiconductor layer stack" which defines the p-n junction and typically comprises a window layer 115 and an absorber layer 120; and a "back contact layer stack" which includes at least a back contact 125, and a back metal electrode 127. The photovoltaic device 100 may further include additional layers, such as an interfacial buffer layer, between the various layers of the device. A high resistance transparent ("HRT") buffer layer between the front contact stack and the window layer is an example.

Photovoltaic devices may further include electrical lead connections or conductors, not shown, that provide a current path to communicate generated current flow, such as from one photovoltaic cell to adjacent cells in a module, or from one photovoltaic module to adjacent modules in an array. Alternatively, the electrical connections may communicate the current flow to an external load device where the photogenerated current provides power.

Each of the above-mentioned layers may comprise a single layer or multiple layers or regions, for example from 1 to 3 layers or regions. Additionally, each layer may be "continuous" and cover all of an underlying layer; or a layer may be "discontinuous" and cover only a portion—for example, from 80 to 99%—of the underlying layer.

During a process to form one of the layers, the created layer forms on an outer surface, typically a top surface, of a substrate or substrate structure. A "substrate structure" may include a substrate layer introduced into a deposition process and any other or additional layers that may have been deposited onto the substrate layer in a prior deposition process. Thus, the "layer stacks" mentioned above may be considered substrate structures. Layers may be deposited over the entirety of a substrate with certain portions of the material later removed through laser ablation, scribing, or other material-removal process.

The substrate layer 105 may be formed from glass, for example, soda lime glass or float glass. Alternatively, the substrate layer 105 may be formed from polymeric, ceramic, or other materials that provide a suitable structure for forming a base of photovoltaic cell. The substrate layer 105 may have additional layers applied (not shown) that promote the transmission of photons through its thickness, which may include anti-reflective coatings or anti-soiling coatings.

The substrate layer 105 has the TCO layer 110 deposited thereon. The TCO layer 110 may be formed from any suitable transparent conductive oxide, including, but not limited to, indium gallium oxide, cadmium stannate, cadmium tin oxide, silicon oxide, tin oxide, cadmium indium oxide, fluorine doped tin oxide, aluminum doped zinc oxide, indium tin oxide, or various combinations of the foregoing. The TCO layer 110 may have any thickness desired, such as between about 300 Å and about 4500 Å, or more specifically between about 300 Å and about 800 Å, or more specifically between about 3500 Å and about 4500 Å. In some embodiments, the TCO layer 110 is formed from a plurality of layers of material comprising $SnO_2$ and $SnO_2$:F.

The window layer 115 is formed on the TCO layer 110 and may be formed from an n-type semiconductor material such as, for example, CdS, CdSSe, CdSe, zinc sulfide (ZnS), a ZnS/CdS alloy, ZnSO, zinc magnesium oxide, cadmium magnesium sulfide, cadmium tin oxide, indium tin oxide, indium-doped cadmium oxide, aluminum-doped zinc oxide, indium zinc oxide, zinc tin oxide, cadmium oxide, zinc aluminum oxide, zinc silicon oxide, a zinc zirconium oxide, tin aluminum oxide, tin silicon oxide, tin zirconium oxide, or another suitable wide-band gap and stable material. It is understood that a buffer layer (not shown) may be formed between the window layer 115 and the TCO layer 110. It is understood that the photovoltaic device 100 may omit the window layer 115, as desired.

The absorber layer 120 is formed on the window layer 115 (if present) and may be formed from cadmium telluride, cadmium zinc telluride, CdSe, cadmium selenium telluride, Cd(S, Se, Te), CdSTe, copper indium gallium selenide, amorphous silicon, combinations of the foregoing, alloys of the foregoing, or any suitable p-type semiconductor material. The absorber layer 115 may be formed by a layer of material that is deposited on the device 100, or the absorber layer 115 may be formed by a plurality of layers of material deposited on the device 100 that are layer processed (e.g., annealing) to form an alloy which is the absorber layer 115. The absorber layer 120 may also be formed from multiple layers of materials that form a gradient across the absorber layer 120 once the multiple layers are annealed, or the absorber layer 120 may be formed from a single layer of material having a gradient of a material formed thereacross. A CdTe absorber layer 120 may have a thickness of about 1.5-3.0 microns.

The back contact 125 is an interfacial layer between the absorber layer 120 and the back metal electrode 127. The combination of the back contact 125 and the back metal electrode 127 may collectively be referred to generally as the back contact stack without a distinction being drawn between the layers. The back contact 125 may be formed from any material including tellurium, selenium, gold, tungsten, tantalum, titanium, palladium, nickel, silver, calcium, lead, mercury, graphite, and the like. The back contact 125 may also include ZnTe, a CdTe—ZnTe alloy (e.g., CdZnTe), ZnTe:Cu, indium nitride, HgTe, Te, and PbTe, or any other suitable material. In some embodiments, the back contact is a bilayer formed of a layer of ZnTe and a layer of CdZnTe alloy. The back contact 125 may also include a layer of Cu disposed thereon with a concentration of about 0.01-1% Cu by atomic weight.

The back metal electrode 127 provides lateral conduction of electricity to the outside circuit. The back metal electrode 127 may be formed from aluminum, copper, nickel, gold, silver, molybdenum nitride, molybdenum, chromium, oxidized metals, nitrides metals, combinations of the foregoing, alloys of the foregoing, or any other metals known to be useful as a conductor in a photovoltaic device. A suitable back contact 125 and electrode 127 is described in the commonly-owned patent application WO2014/151610 for Photovoltaic Device Having Improved Back Electrode and Method of Formation hereby incorporated herein by reference in its entirety, the disclosure of which may be relied upon for enablement with respect to the back contact 125 and electrode 127 portion of the invention. In one embodiment, the back metal electrode 127 is formed from a layer of $MoN_x$ adjacent the back contact 125, a layer of chromium, and a layer of aluminum disposed therebetween. The chromium layer may have a thickness from about 0-200 Å, such as about 200 Å, the aluminum layer may have a thickness 700-1000 Å, such as about 750 Å, and the $MoN_x$ layer may have a thickness from about 50-170 Å, such as about 170 Å.

The TCO layer may form or may be electrically connected to a front contact. The back contact may form or may be electrically connected to a back contact. The front contact forms a current path through which the electrical current generated by the active layers of the photovoltaic device may flow. The back contact forms a second current path through which generated current may flow. The front contact may connect one photovoltaic cell to an adjacent cell in one direction within a photovoltaic module or, alternatively, to a terminal of the photovoltaic module. Likewise, the back contact may connect the photovoltaic cell to a terminal of the photovoltaic module or, alternatively, to an adjacent cell in a second direction within the photovoltaic module, forming a series configuration. The front contact or back contact may connect the photovoltaic cell to an external terminal of the photovoltaic module in which it is located.

If an interfacial layer is present in the photovoltaic device 100, the interfacial layer may be formed from any number of materials and may be disposed between any of the various layers of the photovoltaic device, as desired. The interfacial layer may be a buffer layer or a barrier layer that inhibits the diffusion of chemical ions from, into, or across the substrate 105 or another layer of the device 100. For example, one interfacial layer included in the photovoltaic device 100 may be a barrier layer formed between the substrate layer 105 and the TCO layer 110. The barrier layer may be formed from any suitable material, including, but not limited to, silica, alumina, tin oxide, or silicon aluminum oxide. Another example of an interfacial layer may be a buffer layer formed between the TCO layer 110 and the window layer 115 to reduce recombination of holes and electrons at the interface of the TCO layer 110 and the window layer 115. The buffer layer may be formed of any suitable material, including, but not limited to, tin oxide, zinc oxide, zinc tin oxide, zinc doped tin oxide, indium oxide, a mixture of tin and zinc oxides, zinc stannate, zinc magnesium oxide, zinc oxysulfide, cadmium manganese sulfide, or cadmium magnesium sulfide, or combinations of the foregoing, for example.

The photovoltaic device 100 may include other components (not shown) such as, bus bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

Process of Manufacture

The layers of the photovoltaic device 100, 200 and the devices described herein may be deposited by a sputtering process. In general, sputtering involves the ejectment of atoms from the surface of a target material via energetic bombardment of ions on the surface of the target. Alternatively, the layers may be formed by any other suitable deposition process known in the art, including, but not limited to, pulse laser deposition (PLD), chemical vapor deposition (CVD), electrochemical deposition (ECD), atomic layer deposition (ALD), evaporation, or vapor transport deposition (VTD).

Figure 2:
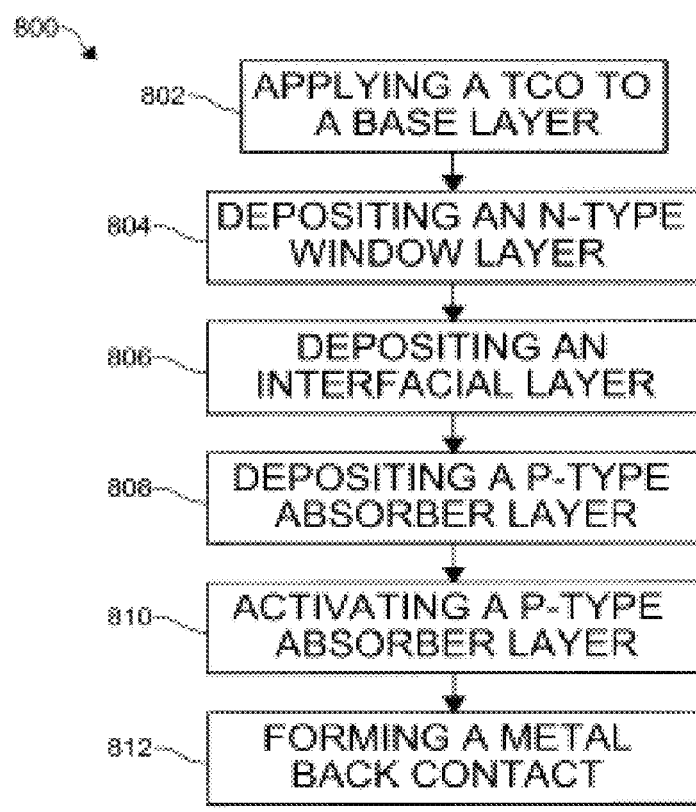
FIG. 2 depicts a process for manufacturing a photovoltaic device according to an embodiment of the invention.

A method of manufacturing a photovoltaic structure, the photovoltaic device 100, for example, is depicted in FIG. 2, can include sequentially forming layers on a substrate. In a first step 802, a TCO layer can be formed on a substrate layer, such as glass. In a second step 804, a window layer can be deposited over the substrate including the previously applied TCO layer and substrate layer. The window layer may include an n-type semiconductor, for example, or the window layer may be omitted. In an optional third step 806, an interfacial layer can be deposited over the substrate including the previously applied n-type window layer, TCO layer, and substrate layer.

In a fourth step 808, an absorber layer can be deposited over the substrate including the optional interfacial layer(s), the n-type window layer, the TCO layer, and the substrate. The absorber layer deposition of the fourth step 808 may include the deposition of one or more precursor layers that require an annealing step or heating step (as described below) after the deposition thereof to form the absorber layer. In embodiments where the absorber layer is formed from one or more precursor layers, a first precursor layer, for example CdSe, is deposited over a substrate structure followed by the deposition of a second precursor layer, for example CdTe, over the first precursor layer. The deposited precursor layers are then annealed (see step 810) to form desired final layer form, for example CdSeTe. The annealing step(s) causes the interdiffusion of Se throughout the CdSeTe layer.

In a fifth step 810, an activation process may be performed on the deposited layers. The activation step 810 can include the introduction of a material containing chlorine to the semiconductor material layers, for example cadmium chloride ($CdCl_2$) as a bathing solution, spray, or vapor, and an associated annealing of the absorber layer at an elevated temperature. For example, if $CdCl_2$ is used, the $CdCl_2$ can be applied over the absorber layer as an aqueous solution. Alternatively, the absorber layer can be annealed with $CdCl_2$ by continuously flowing $CdCl_2$ vapor over the surface of the absorber layer during the annealing step. Alternative chlorine-doping materials can also be used such as $MnCl_2$, $MgCl_2$, $NH_4Cl$, $ZnCl_2$, or $TeCl_4$. A typical anneal can be performed at a temperature of about 350° C.-475° C. for a total duration of 90 minutes or less, with a soaking time equal to or less than about 60 minutes.

A multi-step activation step 810 may be used for each of the embodiments described herein. With each desired activation mechanism in the multi-step activation step 810, such as semiconductor grain growth, chlorine diffusion, sulfur and/or selenium inter-diffusion into the layers, a different thermal activation energy may be required. Using a multi-step process allows each activation mechanism to be optimized. As an example of a multi-step activation process, $CdCl_2$ can be applied in a single step followed by annealing using a multi-step temperature profile. For example, the anneal temperature may be ramped up to 425° C. first, held there for a period of time (e.g. 1-10 minutes) and then ramped up further to 450°-460° C. and held there for an additional period of time (e.g., 1-10 minutes) before ramping the anneal temperature back down. This temperature profile for the above anneal results in different crystallinity characteristics of a CdTe material than those of a device activated in a single anneal step at 425° C. or alternatively at 450°-460° C. As an extension or alternative to this approach, multiple $CdCl_2$ applications, each paired with annealing at varied times and temperatures may also be used to achieve desired layer characteristics. In a sixth step 812, a back contact can be formed over the activated p-type absorber layer.

In accordance with the invention an additional cleaning/passivation step may occur between the activation step 810 and formation of a back contact 812. This cleaning/passivation step is described in more detail below, in conjunction with FIG. 14.

Semiconductor Stack Variations

A number of variations for the semiconductor layer stack are disclosed in WO application PCT/US2015/015387, incorporated herein, along with various methods of making them. For example, in some embodiments, diffusion may be used to blend the compositions of two or more adjacent layers. In some embodiments, an n-type window layer may be composed of cadmium, sulfur and selenium in varying amounts to form a $CdS_{1-x}Se_x$ compound, where x is in the range of about 1 to 25 at %, or alternatively between about 5 to 10 at %. In some embodiments, a p-type absorber layer may be composed of cadmium, selenium, and tellurium in varying amounts to form a $CdSe_xTe_{1-x}$ compound, where x is in the range of about 1 to about 40 at %, or alternatively between about 10 to about 25 at %. In each case, the window or absorber layer may be graded, either stepwise or continuously throughout its thickness or depth. In each case, the window or absorber layer may be compositionally varied as it is deposited, or it may be laid down in individual layers and annealed to cause diffusion of atoms from one layer to another to vary the composition.

In WO application PCT/US2015/015387 it is noted that, in embodiments having a cadmium, selenium, and tellurium absorber layer, a higher concentration of Se near the TCO layer 110 relative to the back contact 125 may allow for a higher fraction of incident radiation to be absorbed in the absorber layer 120. The band gap shift caused by the presence of Se in the absorber layer 120 appears to permit better conversion of longer wavelength red and infrared energy as evidenced by a red shifted absorption edge as measured using wavelength dependence of the quantum efficiency (QE) of the solar cells. This is consistent with extensive intermixing of the Te and Se and/or a gradient of Se within the CdSeTe absorber layer 120 thereby creating a lower band gap alloy. Moreover, Se may improve the passivation of grain boundaries and interfaces, which can be seen through higher bulk lifetime and reduced surface recombination.

Other optional layers and configurations are disclosed in the following US patents, the disclosure of each is incorporated by reference: U.S. Pat. Nos. 8,603,253; 8,785,232; 8,748,214; 8,497,151; 8,431,427; 8,741,687; and 8,525,021.

Figure 3:
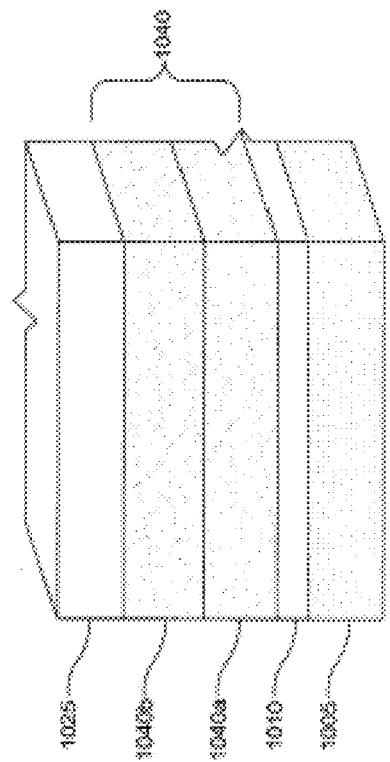

FIG. 3 illustrates an embodiment of a photovoltaic device 200 according to an embodiment of the invention. The layers of the photovoltaic device 200 are similar to the photovoltaic device 100 except as described below. The photovoltaic device 200 includes an n-type window layer 230 comprising cadmium sulphoselenide (CdSSe) deposited over a substrate layer 205 and a TCO layer 210. A p-type absorber layer 220 is deposited over the CdSSe layer 230. The CdSSe layer 230 and the p-type absorber layer 220 form a p-n junction in the photovoltaic device 200. A back contact 225 is formed over the p-type absorber layer 220. The TCO layer 210 allows light to pass through to a semiconductor window layer 215 while serving as an ohmic electrode to transport photogenerated charge carriers away from the light absorbing material. The back contact 225 serves as a second ohmic electrode to transport photogenerated charge carriers.

The n-type CdSSe layer 230 forms the window layer, that is, the n-type region of the p-n junction within the photovoltaic device 200. The thickness of the CdSSe layer 230 can be between 10 nm to 100 nm thick or alternatively between 30 nm and 75 nm thick. The CdSSe layer 230 may be composed of cadmium, sulfur and selenium in varying amounts to form a $CdS_{1-x}Se_x$ compound, where x is in the range of about 1 to 25 at %, or alternatively between about 5 to 10 at %. The compositional ratio or atomic percentage (at %) of a compound, for example $CdS_{1-x}Se_x$, is determined by comparing the number of sulfur atoms and the number of selenium atoms in a given amount of the compound with the total sum of sulfur and selenium atoms in the given amount. For example, where x=10 at %, there are 9 sulfur atoms for every 1 selenium atom in a given amount of $CdS_{90\%}Se_{10\%}$ compound.

Although the disclosed embodiments may describe a CdSSe layer as a single layer within the device, in each case the CdSSe layer may comprise multiple layers of CdSSe of varying composition to form a continuous or step-wise gradient of the sulfur to selenium ratio. For example, the CdSSe layer 230 may be formed as a single layer of $CdS_{1-x}Se_x$ where x is held constant throughout the formation process. Alternatively, the CdSSe layer 230 may be formed sequentially as multiple layers of $CdS_{1-x}Se_x$ where x varies in value for each of the sequentially formed layers. For example, a first $CdS_{1-x}Se_x$ layer may be deposited where x=5 at %, and a second $CdS_{1-x}Se_x$ layer may be deposited where x=10 at %. These two adjacent layers may together form the CdSSe layer 230. As a further alternative, the ratio of sulfur to selenium may be varied continuously throughout the formation process so that, for example, the composition of the formed $CdS_{1-x}Se_x$ layer at a first end is x=5 at % and at a second end is x=10 at %, and where x varies continuously from 5 at % to 10% between the first and second ends. The whole of the formed layer having the continuous gradient may form the CdSSe layer 230.

The p-type absorber layer 220 may include a p-type semiconductor material to form the p-type region of the p-n junction within the photovoltaic device 200. The absorber layer 220 preferably absorbs photons passing through from the CdSSe window layer 230 to mobilize charge carriers. The absorber layer 220 may be formed of CdTe, for example. An absorber layer 220 formed of CdTe may further include impurities or dopants in the CdTe bulk material. The absorber layer 220 may be between 200 nm to 8000 nm thick, or alternatively between 1000 nm to 3500 nm thick. The absorber layer 220 may be formed over the CdSSe window layer 230 by a deposition process, such as vapor transport deposition, atomic layer deposition, chemical bath deposition, sputtering, closed space sublimation, or any other suitable process. In the following alternative embodiments, similar layers as those described in the first embodiment are included and similarly numbered (incremented by 100).

In another embodiment of the invention (not shown) similar to that shown in FIG. 3, a CdS layer (not shown) is deposited between the CdSSe layer 230 and the TCO layer 210. During an activation step, such as annealing, the CdSSe layer 230 may diffuse into the CdTe absorber layer, thereby forming a graded $CdS_xTe_ySe_z$ layer at the interface between the CdSSe layer 230 and the absorber layer 220, where $0<x<1, 0<y<1, 0<z<1$ at % and x+y+z=1. For example, in an embodiment including a CdSSe layer as either a window layer or as an interfacial layer between a CdS layer and a CdTe absorber layer, during the activation step the CdSSe layer may diffuse into the CdTe absorber layer, thereby forming a graded $CdS_xTe_ySe_z$ layer at the interface between the interfacial layer and the absorber layer, where $0<x<1, 0<y<1, 0<z<1$ at % and x+y+z=1.

Figure 4:
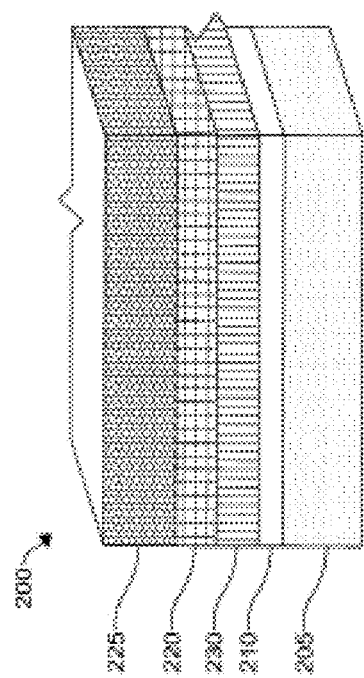

According to another embodiment of a photovoltaic device 1000, as depicted in FIG. 4, a TCO layer 1010 is formed on a substrate layer 1005. The layers of the photovoltaic device 1000 are similar to those of the photovoltaic device 100 except as described below. A p-type cadmium selenide telluride (CdSeTe) layer 1040 is formed over the TCO layer 1010. The TCO layer 1010 may include a material doped to be n-type in order to form a p-n junction with the p-type CdSeTe layer 1040. A back contact 1025 is formed over the p-type CdSeTe layer 1040. The photovoltaic device 1000 may also include a window layer (not shown) disposed between the TCO layer 1010 and the CdSeTe layer 1040. The window layer may be formed from ZnMgO, ZnSO, CdMgS, or other suitable wide-band gap and stable materials such as those disclosed hereinabove with respect to the photovoltaic device 100.

The CdSeTe layer 1040, as a p-type absorber layer, preferably absorbs the photons passing through from the substrate layer 1005 and TCO layer 1010 to mobilize charge carriers. The thickness of the CdSeTe layer 1040 can be between about 200 nm to 5000 nm thick or alternatively between about 500 nm and 3500 nm thick. The CdSeTe layer 1040 may be composed of cadmium, selenium, and tellurium in varying amounts to form a $CdSe_xTe_{1-x}$ compound, where x is in the range of about 1 to about 40 at %, or alternatively between about 10 to about 25 at %.

The CdSeTe layer 1040 can be manufactured by a deposition process, such as vapor transport deposition, atomic layer deposition, chemical bath deposition, sputtering, closed space sublimation, or any other suitable process noted hereinabove. In forming the CdSeTe layer 1040 using a process requiring the evaporation of powder, such as vapor transport deposition, the CdSeTe layer 1040 may be formed from the co-evaporation of a blended mixture of CdSe and CdTe powder, or the evaporation of a pre-alloyed CdSeTe powder. The composition of the blended powders for co-evaporation or the composition of a pre-alloyed powder can be tailored so that the as-deposited film achieves the desired $CdSe_xTe_{1-x}$ compositional ratio. Alternatively, a CdSeTe layer may be formed by sequentially depositing a CdSe layer followed by depositing a CdTe layer with a subsequent annealing or heat treatment process to allow alloying of the two layers to achieve the desired $CdSe_xTe_{1-x}$ compositional profile (i.e., a gradient of Se across the CdSeTe layer 1040, where x is in the range of about 1 to about 40 at %, or between about 10 to about 25 at %). The annealing or heat treatment process may be a separate step in a manufacturing process or may occur concurrently with the subsequent deposition or annealing of a further layer of the photovoltaic device, for example the deposition of a back contact 1025 or annealing of CdTe absorber layer.

The CdSeTe layer 1040 may also be manufactured by a deposition process resulting in a gradient of Se in the CdSeTe layer 1040. The gradient may result in a concentration of Se adjacent the TCO layer 1010 and a lower concentration of Se adjacent the back contact 1052. It is understood that the concentration of Se adjacent the back contact 1025 may be zero, as desired. The concentration of Se adjacent the TCO layer 1010 may be lower than a concentration of Se adjacent the back contact 1025, as desired.

Other Se concentration gradients are possible. For example, positive results have been obtained in a photovoltaic device 1000 having a desired gradient in the CdSeTe layer 1040 with a concentration of Se higher adjacent a TCO layer 1010 and a lower concentration of Se adjacent the back contact 1025 by annealing a stack of layers including CdSe (adjacent the TCO layer 1010)/CdSeTe/CdSe/CdTe (adjacent the back contact 1025). Positive results have also been obtained in a photovoltaic device 1000 having a desired gradient in the CdSeTe layer 1040 by annealing a stack including CdSe/CdTe. Furthermore, positive results have been obtained in a photovoltaic device 1000 having a desired gradient in the CdSeTe layer 1040 by annealing and a stack including the following stack of layers CdSe/CdSeTe/CdTe.

Figure 5:
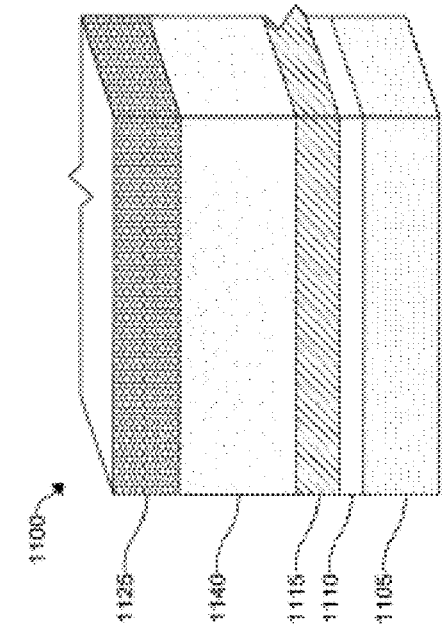

In some embodiments, as shown in FIG. 5, the concentration of Se in the layer 1040 may vary between a plurality of regions, such as a first region 1040a and a second region 1040b, and the regions may continuously change across the thickness of the respective regions. In some instances, the rate of change in concentration in the regions may itself vary through one or more of the regions, for example, increasing in some portions and decreasing in yet other portions. Similarly, in some embodiments, the first region 1040a may have a band gap that is lower than a band gap of the second region 1040b. In such instances, the concentration of selenium in the first region 1040a relative to the second region 1040b may be in a range such that the band gap of the first region 1040a is lower than the band gap of the second region 1040b.

Although the disclosed embodiments shown in FIGS. 4 and 5 may describe a CdSeTe layer as a single layer of the absorber layer 1040 within the device, in each case the CdSeTe layer may comprise multiple layers of Cd, Se, CdSe, Cd(S, Se, Te) and/or CdSeTe of varying composition to form the gradient (continuous or step-wise) of the selenium to tellurium ratio. For example, the CdSeTe layer 1040 may be formed as a single layer of $CdSe_xTe_{1-x}$ where x is held constant throughout the formation process. Alternatively, the CdSeTe layer 1040 may be formed sequentially as multiple layers of $CdSe_xTe_{1-x}$ where x varies in value for each of the sequentially formed layers. For example, a first $CdSe_xTe_{1-x}$ layer may be deposited where x=10 at %, and a second $CdSe_xTe_{1-x}$ layer may be deposited where x=5 at %. These two adjacent layers may together form the CdSeTe layer 1040. As a further alternative, the ratio of selenium to tellurium may be varied continuously throughout the formation process so that, for example, the composition of the formed $CdSe_xTe_{1-x}$ layer at a first end is x=10 at % and at a second end is x=5 at %, and where x varies continuously from 10 at % to 5% between the first and second ends. The whole of the formed layer having the continuous gradient may form the CdSeTe layer 1040. Alternatively, a graded CdSeTe layer 1040 may be formed from a multi-layered deposition process where each of the multi-layers includes Se (e.g., Se, CdSe, CdSeTe, Cd(S, Se, Te), and the like) and each of the layers has a different concentration of Se. For example, a first layer of material to form the CdSeTe layer 1040 adjacent the TCO layer 1010 may have a thickness less than a thickness of subsequent layers but with a higher concentration of Se therein. Another example includes a multi-layer deposition of materials that includes S in a first layer of material deposited adjacent the TCO layer 1010. When the multi-layers are annealed to form the CdSeTe layer 1040, the material of the first layer and the S present therein may be substantially present only adjacent the TCO layer 1010 or the S may be allowed to disperse throughout the layer 1040. In yet another example, the multi-layer deposition of materials to form the CdSeTe layer 1040 has a concentration of Se that declines across the thickness thereof, and that includes S adjacent the TCO layer 1010.

In processes including a multi-layer deposition, the CdSeTe layer 1040 includes a plurality of grains separated by grain boundaries. In some embodiments, an atomic concentration of selenium in the grain boundaries is higher than the atomic concentration of selenium in the grains. In some embodiments, a ratio of the average atomic concentration of selenium in the grain boundaries to the average atomic concentration of selenium in the grains is greater than about 2. In some embodiments, a ratio of the average atomic concentration of selenium in the grain boundaries to the average atomic concentration of selenium in the grains is greater than about 5. In some embodiments, a ratio of the average atomic concentration of selenium in the grain boundaries to the average atomic concentration of selenium in the grains is greater than about 10.

Figure 6:
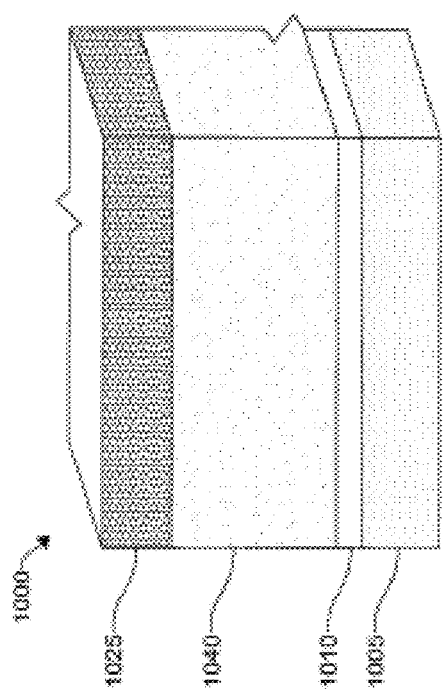

According to another embodiment of a photovoltaic device 1100, as depicted in FIG. 6, a window layer 1115 is formed over a TCO layer 1110 over the substrate layer 1105. The layers of the photovoltaic device 1100 are similar to those of the photovoltaic device 1000 except as described hereinbelow. A p-type CdSeTe layer 1140 is formed over the window layer 1115. The window layer 1115 forms a p-n junction with the p-type CdSeTe layer 1140. A back contact 1125 is formed over the p-type CdSeTe layer 1140.

According to an embodiment of the invention depicted in FIG. 7, a photovoltaic device 1200 includes a TCO layer 1210 is formed over a substrate layer 1205. The layers of the photovoltaic device 1200 are similar to those of the photovoltaic device 100 except as described below. A cadmium sulfur selenide telluride (Cd(S,Se,Te)) layer 1242 is formed over the TCO layer 1210. A back contact 1225 is formed over the p-type Cd(S,Se,Te) layer 1242. The Cd(S,Se,Te) layer 1242 is formed from a compound of cadmium, sulfur, selenium, and tellurium, $CdS_ySe_xTe_{1-(x+y)}$) where $0<x<1$, and $0<y<1$, and $0<(x+y)<1$, or alternatively where $0.02<x<0.25$ and $0.02<y<0.25$, or as a further alternative, where $0.05<x<0.20$ and $0.02<y<0.05$. The Cd(S,Se,Te) layer 1242 is between about 200 nm to about 5000 nm thick, or alternatively between about 500 nm to about 3500 nm thick.

In one embodiment, the Cd(S,Se,Te) layer 1242 comprises multiple sub-layers where x and y vary to provide preferred concentrations a various points through the layer thickness. For example, in one embodiment both x and y may vary to provide a higher sulfur and selenium concentration adjacent the TCO layer 1210, and decrease throughout the thickness of the layer moving away from the TCO layer 1210. In other alternative embodiments, the value of x or y or both may remain constant throughout the Cd(S,Se,Te) layer 1242 between the TCO layer 1210 and back contact 1225.

The Cd(S,Se,Te) layer 1242 can be manufactured by a deposition process, such as vapor transport deposition, atomic layer deposition, chemical bath deposition, sputtering, closed space sublimation, or any other suitable process. However, in forming the Cd(S,Se,Te) layer 1242 using a process requiring the evaporation of powder, such as vapor transport deposition, the Cd(S,Se,Te) layer 1242 may be formed from the co-evaporation of a blended mixture of CdS, CdSe, and CdTe powders, or the evaporation of a pre-alloyed Cd(S,Se,Te) powder. The composition of the blended powders for co-evaporation or the composition of a pre-alloyed powder can be tailored so that the as-deposited film achieves the desired $CdS_ySe_xTe_{1-(x+y)}$) compositional ratio. Alternatively, a Cd(S,Se,Te) layer may be formed by sequentially depositing a CdS layer followed by depositing a CdSeTe layer, or various other combinations of compounds containing cadmium, sulfur, selenium and tellurium, with a subsequent annealing or heat treatment process to allow alloying of the two layers to achieve the desired $CdS_ySe_xTe_{1-(x+y)}$ compositional ratio. The annealing or heat treatment process may be a separate step in a manufacturing process or may occur concurrently with the subsequent deposition of a further layer of the photovoltaic device, for example the deposition of the back contact 1225.

According to another embodiment of the invention shown in FIG. 8, a photovoltaic device 1400 includes a TCO layer 1410 formed over a substrate layer 1405. An absorber layer 1421 is formed adjacent the TCO layer 1410. The absorber layer 1421 may be formed via the annealing of a CdTe layer 1420 and a CdSe layer 1411, as described herein. A back contact 1425 is formed over the CdTe layer 1420, and a back metal electrode 1427 is formed over the back contact 1425. The TCO layer 1410 may have any thickness desired, such as between about 300 Å and about 4500 Å, or more specifically between about 300 Å and about 800 Å, or more specifically between about 3500 Å and about 4500 Å. In this embodiment, the TCO layer 1410 is formed from a plurality of layers of material comprising $SnO_2$ and $SnO_2$:F. If more than one layer of each $SnO_2$ and $SnO_2$:F is present, that materials may be alternating. The CdSe layer 1411 formed on the $SnO_2$ layer has a thickness of about 900-1500 Å. The CdTe layer 1420 has a thickness of about 1.7-2.5 microns. The CdTe layer 1420 may be formed from the deposition of a single layer of material, or the CdTe layer 1420 may be formed from the deposition of two or more layers of CdTe, Cd, and/or Te. The combination of the CdSe layer 1411 and the CdTe layer 1420 layer may have a thickness of about 0.5-3.5 microns, as desired. The back contact 1425 is formed from ZnTe. Alternatively, the back contact 1425 may be formed from a layer of ZnTe and a layer of CdZnTe alloy. The back contact 1425 may also include a layer of Cu disposed thereon with a concentration of about 0.01-1% Cu by atomic weight. The back metal electrode 1427 is formed from a layer of $MoN_x$ adjacent the back contact 1425, a layer of chromium, and a layer of aluminum disposed therebetween. The chromium layer may have a thickness from about 0-200 Å, such as about 200 Å, the aluminum layer may have a thickness 700-1000 Å, such as about 750 Å, and the $MoN_x$ layer may have a thickness from about 50-170 Å, such as about 170 Å.

A method of manufacturing the photovoltaic structure 1400 includes steps similar to those described above and shown in FIG. 2 except that the CdSe layer 1411 is deposited on the TCO layer 1410. The CdSe layer 1411 may be deposited using a sputtering deposition process. A first layer of CdTe 1420a (a precursor layer) is then deposited on the CdSe layer 1411. A second layer of CdTe 1420b (another precursor layer) is then deposited on the first layer of CdTe 1420a. Once the second layer of CdTe 1420b has been applied, the CdTe layer 1420 is formed, as shown in FIG. 8a. The CdSe 1411 and the CdTe layer 1420 are then annealed to form an alloy thereof, CdSeTe, as the absorber layer 1421 as shown in FIG. 8. The underlying layers, once annealed may result in an absorber layer 1421 having a thickness of about 0.5-3.5 microns, of about 1-3 microns, a thickness of about 1 micron, a thickness of about 3.0 microns, as desired. The annealing process may consume substantially all of the CdSe layer 1411, or a portion of the CdSe layer 1411 may remain between the TCO layer 1410 and the CdSeTe absorber layer 1421. Similarly, the annealing process may consume substantially all of the CdTe layer 1420, or a portion of the CdTe layer 1420 may remain between the CdSeTe absorber layer 1421 and the back contact 1425.

The embodiment shown in FIG. 8b is similar to the embodiment described with respect to FIG. 8a with methods of forming each substantially the same except that a CdSeTe layer 1413 is deposited on the CdSe layer 1411 prior to deposition of the CdTe layer 1420 in either a single layer deposition of CdTe or in multiple layers of CdTe. The CdSe layer 1411, the CdSeTe layer 1413, and the CdTe layer 1420 are then annealed to form the absorber layer 1421 as shown in FIG. 8. The annealing process may consume substantially all of the CdSe layer 1411 or a portion of the CdSe layer 1411 may remain adjacent the TCO layer 1410. Similarly, the annealing process may consume substantially all of the CdTe layer 1420 or a portion of the CdTe layer 1420 may remain between the CdSeTe absorber layer 1421 and the back contact 1425.

Once the absorber layer 1421 is formed (either from the structure described above and shown in FIG. 8a or from the structure described above and shown in FIG. 8b), the absorber layer 1421 is then cleaned to remove impurities, debris, oxides, and the like that have formed thereon. The absorber layer 1421 may be cleaned with oxalic acid, hydrochloric acid, or any acid or other suitable cleaning material. The absorber layer 1421 may be then be doped with Cu. For example, if hydrochloric acid is used to clean the absorber layer 1421, the absorber layer 1421 may be subsequently doped with Cu in a concentration of about 0.5-1.0 ppm. The hydrochloric acid cleaning step may be combined with the Cu doping step, as desired.

The back contact 1425 is then deposited on the cleaned absorber layer 1421. The back contact 1425 may be formed via the deposition of a single ZnTe layer or from the deposition of a ZnTe layer adjacent the absorber layer 1421 and a CdZnTe layer adjacent the ZnTe layer. The CdZnTe layer may be formed by depositing a layer of CdTe on the ZnTe layer and then annealing the same to form the alloy therebetween. The back contact may comprise a bilayer of a metal layer consisting essentially of a metal selected from aluminum, copper, nickel, gold, silver, molybdenum, tungsten, chromium, and oxides or nitrides thereof; and a second layer that comprises CdZnTe, ZnTe, or both. The back contact 1425 may also include a layer of Cu disposed thereon with a concentration of 0.01-1% Cu by atomic weight. The layer of Cu may be disposed between the absorber layer 1421 and the back contact 1425, between the layers of the back contact 1425, or between the back contact 1425 and the back metal electrode 1427, as desired. The back metal electrode 1427 is then deposited on the back contact 1425. The back metal electrode 1427 is formed from a layer $MoN_x$ formed adjacent the back contact 1425, then a layer of aluminum, and then a layer of chromium.

FIG. 9 shows a photovoltaic device 1500 according to another embodiment of the invention. The photovoltaic device 1500 is similar to the photovoltaic device 1400 of FIG. 8 except that the device 1500 includes a window layer 1515 between a TCO layer 1510 and an absorber layer 1521. Like the photovoltaic device 1400, the photovoltaic device 1500 includes a substrate layer 1505 with the TCO layer 1510 formed thereon, the absorber layer 1521, and a back contact 1525 disposed between a back metal electrode 1527 and the absorber layer 1521. The window layer 1515 is formed from CdS.

FIG. 10 shows a photovoltaic device 1600 similar to the embodiment of FIG. 8 except as described hereinbelow. The substrate layer 1605 has a TCO layer 1610 formed from $SnO_2$:F. An undoped, higher resistivity buffer layer 1612 formed from $SnO_2$ is formed over the TCO layer 1610. The buffer layer has a thickness of about 20 nm-60 nm with a carrier concentration of $1\times10^{17}$ to $1\times10^{19}$ $cm^{-3}$. The photovoltaic device 1600 does not include a window layer. The absorber layer 1620 is formed from a graded composition of $CdSe_xTe_{1-x}$. A bandgap of the absorber layer 1620 is reduced by the presence of Se therein. The variable "x" ranges between $0.05<x<0.30$ proximate to the TCO layer 1610; and $x<0.01$ at a distance from about 800 nm to about 2000 nm away from the TCO layer 1610. The crystal structure is a zinc blend having a residual hexagonal wurtzite structure <5% volume (less than about 5 grains per 100). A total thickness of the absorber layer 1620 ranges from about 1500 nm to about 4500 nm. The absorber layer 1620 can be formed by depositing CdSe/CdTe, $CdSe/CdSe_xTe_{1-x}$/CdTe, CdTe/CdSe/CdTe, $CdS_ySe_{1-y}$/CdTe or $CdSe_xTe_{1-x}$/CdTe film stacks followed by an annealing process similar to that described above with respect to FIG. 8. A back contact 1625 formed from ZnTe or a CdZnTe—ZnTe combination is formed thereon, with a back metal electrode 1627 formed over the back contact 1625.

In the embodiment of FIG. 10, a $CdCl_2$ annealing treatment is provided. The structure is annealed in the presence of $CdCl_2$ flux at a temperature sufficiently high and for a duration sufficiently long to achieve a mid-film grain size of >2 um and with a continuous Se concentration grading. Typical conditions for annealing would be at a temperature from about 420° C. to about 460° C. for between about 5 minutes to about 60 minutes. Chemical additions of $CdCl_2$ to lower eutectic temperature of the $CdCl_2$—CdTe system can be used. For example, from about 20 mg/liter to about 200 mg/liter NaCl in from about 50 gm/liter to about 300 gm/liter aqueous $CdCl_2$ solutions can be added.

Another photovoltaic device 1700 according to another embodiment of invention is shown in FIG. 11. The embodiment of FIG. 11 is similar to the embodiment of FIG. 10 except as described herein. The photovoltaic device 1700 includes a substrate layer 1705 having a TCO layer 1710 formed thereon. A buffer layer 1712 is formed on the TCO layer 1710. To eliminate intermixing of the materials forming an absorber layer 1720 that would result in a continuous Se profile with a peak Se concentration located at an interface between the device buffer layer 1712 and the absorber layer 1720, a deposition sequence is changed such that the absorber is formed with multiple layers of material including Se (e.g., Se, CdSe, and the like). A layer with the highest Se concentration is deposited after a layer a lower Se concentration. In the embodiment of FIG. 11, a layer 1720a of CdTe or low Se mole fraction $CdSe_xTe_{1-x}$ is deposited first followed by a deposition of a CdSe or large Se mole fraction $CdSe_xTe_{1-x}$ layer 1720b. A further layer 1720c of CdTe and/or a low Se mole fraction $CdSe_xTe_{1-x}$ is deposited last. The further layer 1720c may be the same as the layer 1720a or different therefrom so long as the layer 1720c has a lower Se concentration than the layer 1720b. A subsequent $CdCl_2$ treatment intermixes the layers 1720a, 1720b,1720c thereby creating a continuous Se profile in the absorber layer 1720. During the $CdCl_2$ treatment Se diffuses to the interface between the buffer layer 1712 and the absorber layer 1720, which is favorable to interface passivation. The Se concentration at the interface, however, is still lower than in a device where a CdSe or high Se mole fraction $CdSe_xTe_{1-x}$, such as that of the layer 1720b, is deposited first. This deposition sequencing improves an alignment of the buffer and absorber conduction bands while not impacting current collection. Collection losses due to excessive buffer/absorber conduction band offset CBO are avoided, while the Se concentration profile is optimized for maximum light absorption and device performance.

According to additional embodiments of the invention, the absorber layer of the photovoltaic devices disclosed herein, for example photovoltaic device 1400, 1500, 1600, and/or 1700 may include an absorber layer 1421, 1520, 1620, and/or 1720 that may have one of the following compositions to address concerns regarding Se diffusion into a CdTe layer thereof during an annealing process to obtain a desired Se profile:

a) A first structure provides three layers including a layer of CdSe having a thickness from 0.15 μm to about 0.25 μm/a layer of CdSeTe from about 0.25 μm to about 0.5 μm thick/and a layer of CdTe from about 2.75 μm to about 3.25 μm thick. The CdSeTe layer may be $CdSe_xTe_{1-x}$ where x is from about 10 at % to about 30 at % Se.

b) Another structure provides four layers including from about 0.15 μm to about 0.35 μm thickness CdSe/from about 0.75 μm to about 1.5 μm thickness CdTe/from about 0.1 μm to about 0.25 μm thickness CdSe/and about 1.5 μm to about 3 μm thickness CdTe.

c) Another structure provides four layers including from about 0.15 µm to about 0.35 µm thickness CdSe/from about 0.75 µm to about 1.5 µm thickness CdTe/from about 0.1 µm to about 0.5 µm thickness CdSeTe (having from about 10 at % to about 30 at % Se)/and from about 1.5 µm to about 3 µm thickness CdTe.

d) Another structure provides five layers including from about 0.1 µm to about 0.5 µm thickness CdSeTe (having from about 10 at % to about 30 at % Se)/from about 0.15 µm to about 0.35 µm thickness CdSe/from about 0.75 µm to about 1.5 µm thickness CdTe/from about 0.1 µm to about 0.25 µm thickness CdSe/and from about 1.5 µm to about 3 µm thickness CdTe.

e) Another structure provides five layers including from about 0.1 µm to about 0.5 µm thickness CdSeTe (having from about 10 at % to about 30 at % Se)/from about 0.15 µm to about 0.35 µm thickness CdSe/from about 0.75 µm to about 1.5 µm thickness CdTe/from about 0.1 µm to about 0.5 µm thickness CdSeTe (having from about 10 at % to about 30 at % Se)/and from about 1.5 µm to about 3 µm thickness CdTe.

In each of the structures a) to e), the presence of CdSe layers, particularly the presence of CdSe as a third or fourth layer, slows down the Se fluxing from the first CdSe layer due to the small Se concentration gradient. The CdSe layer is allowed to mix with the CdTe layer to form a uniformly thick CdSeTe alloy layer.

For each of the structures a) to e), a device activation process may be performed (e.g., semiconductor grain growth, chlorine diffusion, sulfur and/or selenium inter-diffusion into the layers, and the like). In some embodiments of the invention, the activation step involves a process wherein the CdTe surface is treated with a $CdCl_2$ concentrated solution for a period from about 25 minute to about 40 minutes. The device activation process may be followed by a first recharging process for a first duration, which can be performed in either one or two steps. The recharging process may then followed by a second recharge step having a second duration less than the first duration to replenish any lost Cl.

Figure 12:
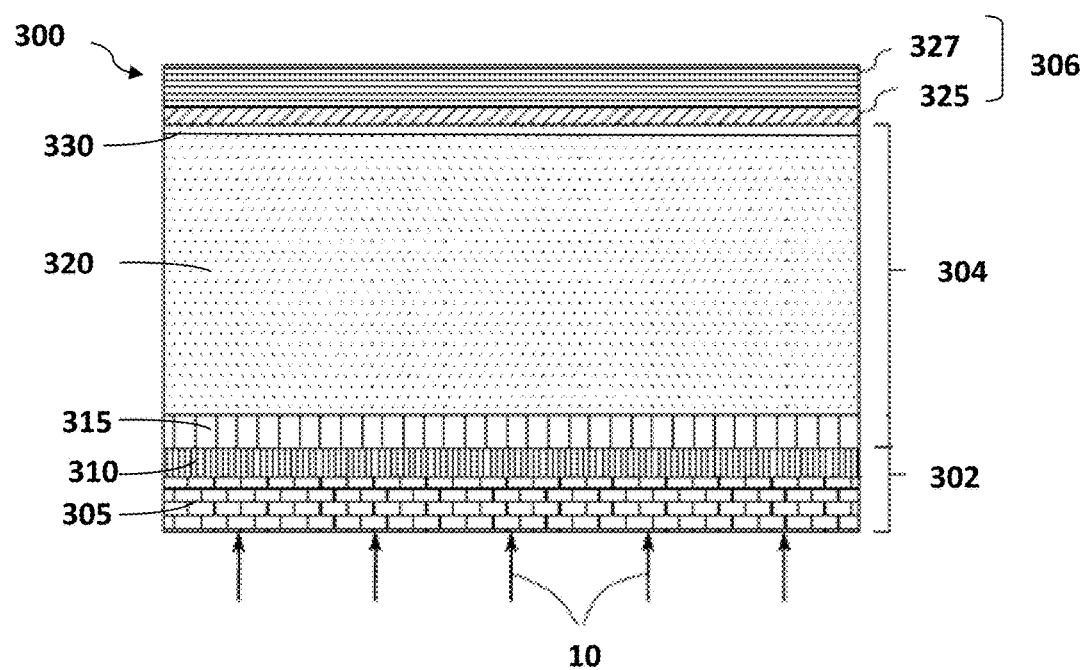
FIG. 12 depicts a schematic of functional layers according to an embodiment of a photovoltaic device.

Referring now to FIG. 12, an alternate embodiment is shown having, in some cases, layers similar to the embodiment of FIG. 1 and using similar reference numbers (incremented by 200) for similar parts. Thus, the photovoltaic device 300 comprises: a front contact stack 302 comprising a substrate 305 and a transparent conductive oxide layer 310; a semiconductor stack 304 comprising a window layer 315 and an absorber layer 320; and a back contact stack 306 comprising a back contact layer 325 and a metal electrode layer 327. This embodiment differs from that of FIG. 1 in depicting a thin oxide layer 330 disposed between the absorber layer 320 and the back contact stack 306. Although represented as part of the semiconductor stack 304, it could also be viewed as the first part of the back contact stack. Since the oxide layer 330 is disposed between the semiconductor layer and the back contact stack, it is somewhat arbitrary into which category it is placed. The oxide layer 330 may be included with any of the semiconductor stack variations described herein.

This oxide layer 330 may be only a few angstroms thick, for example from about 2 Å to about 100 Å or from about 3 Å to about 50 Å, or from about 5 Å to about 30 Å and may be a passivating and/or barrier layer that can be deposited during or after a plasma ion cleaning process as is described in more detail herein. For CdTe absorber layers, the composition of the oxide layer may be $CdTeO_3$. The oxide layer 330 may passivate by repairing crystalline structure damage caused by various wet or dry cleaning processes, such as those described below. The oxide layer 330 may also serve as a barrier layer for against any copper diffusing from the back contact area into the absorber layer and front contact. Copper may result from various wet or dry cleaning processes, or from the back contact stack layers either as a complete metal layer or as an intentional dopant of such layers.

Plasma Cleaning and Oxygen Purge Process

As mentioned previously, methods according to the invention include cleaning and passivation to prepare the absorber surface for receiving other layers such as a back contact layer. Although this cleaning step will be discussed herein as part of a multi-step activation process 810, it might also be viewed as part of the back formation step 812. It occurs between these two steps. Plasmas are used in the cleaning step.

Plasmas have been used in various disciplines to modify the surfaces of solid materials, sometimes altering their surface energy. In some cases, semiconductor wafers have been cleaned by plasma processes to remove organic contaminants. Plasmas have been used to remove photoresists in both ashing- and descum-type processes. Plasmas are the fourth physical state of matter and are achievable at the highest energy states. A gas becomes a plasma when subjected to an energy input that ionizes the molecules to from charged species, which behave differently than simple kinetic molecular collisions. A number of different plasma formation procedures are known, depending on the equipment, conditions and energy input. These include, for example, anode layer ion source (ALIS) plasma, glow discharge plasma, inductive coupling plasma, direct current (DC) plasma, radio frequency (RF), microwave plasma, etc. By way of example only, a linear ALIS plasma process was used in the generation of the data and examples herein.

Figure 13:
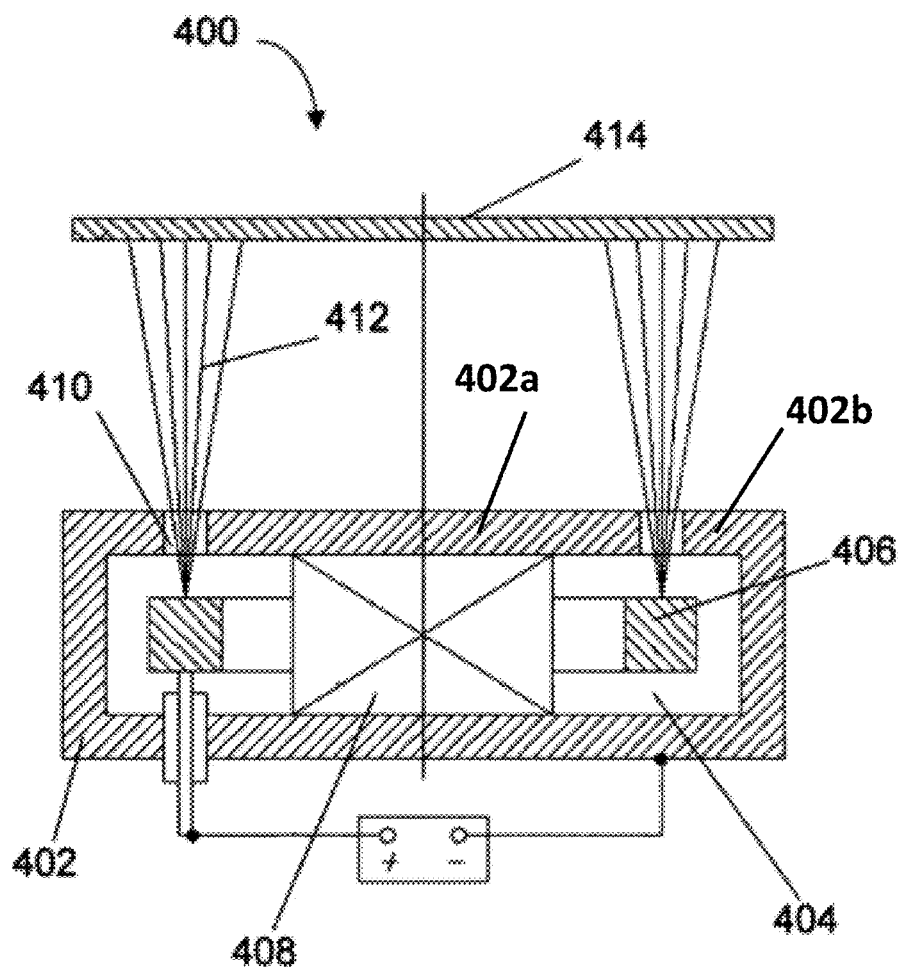
FIG. 13 depicts a cross-sectional schematic of a linear anode layer ion source (ALIS) process setup and equipment.

Anode Layer Ion Source (ALIS) plasmas rely upon the Hall current produced under a combined, crossed electric field, E, and magnetic field, B, that drive a so-called "Hall" current around a closed path known as a racetrack. Referring to FIG. 13, a generalized instrument 400 is shown in cross section for a linear ALIS plasma process. The setup includes a magnetic conductive housing 402 that may optionally be cooled, for example, by internal water cooling passages (not shown). The housing 402 defines an interior discharge channel 404 and includes openings 410 that are, in plan view, in a closed loop path in the shape of a circular, elliptical, or oval racetrack. The openings 410 thus divide the top portion of the housing 402 into an inner cathode 402*a* and an outer cathode 402*b*. The housing 402 is magnetized by permanent magnets 408, such that the edges of the openings 410 form N and S poles and a magnetic field, B, is formed in the opening 410 between the poles in a lateral or X-direction (right to left in FIG. 13). Anode 406 is arranged in the interior channel 404 in housing 402 and disposed beneath the racetrack opening 410. The anode may also be cooled by internal water cooling passages (not shown). A DC voltage of a few hundreds to a few thousands volts is applied to the anode relative to the grounded cathode, which creates an electric field, E, in a Z-direction (vertical in FIG. 13), which is orthogonal to the magnetic field, B. This sets up a Lorenz force that produces a Hall current, accelerating electrons along the racetrack path in the Y-direction (into or out of the plane of the page in FIG. 13). An ionizable gas from a gas source (not shown) flows into the interior discharge channel 404 via gas inlets, (not shown). Electrons traveling around the racetrack in the Hall current between the anode 406 and cathodes 402*a*, 402*b* impact and ionize the gas to form a plasma 412 that is accelerated and emitted from the openings 410 and may be directed toward a substrate 414 as shown. The substrate 414 may be a CdTe or other semiconductor layer surface in accordance with the invention. When the plasma is directed toward a substrate, this is typically done in a vacuum chamber. ALIS plasma generating instruments are well known in the art and are commercially available from a number of suppliers, including, for example, Veeco (Plainview, N.Y.), General Plasma, Inc, (Tucson, Ariz.), Gencoa (Liverpool, UK), and Von Ardenne (Dresden, DE), so only this brief description is included here.

Use of a plasma in a cleaning and/or passivation step may be in place of or in addition to other activation steps described above. In cleaning/passivation steps, the plasma may be generated at room temperature (about 22° C.) and up to about 400° C., for example from about 50° C. to about 350° C. The plasma may be generated by applying voltages from about 700 volts to about 3 kilovolts, for example from about 1000 volts to about 2000 volts. The plasma cleaning treatment step may last from 0.1 to 20 minutes; for example, from 0.2 to 10 minutes, or from 0.2 to 3 minutes.

The composition of the ionizable gas may vary depending on embodiments, but it generally includes an inert base gas, such as neon (Ne), argon (Ar), or Xenon (Xe). In some two-stage embodiments, this is the sole component of the plasma for cleaning purposes. In other one-stage embodiments, the ionized gas further contains a percentage of oxygen mixed in the inert base, the oxygen ranging from about 1% to about 60%, or from about 2% to about 55%, or from about 3% to about 40%. Oxygen mixture percents are expressed as volume %.

Figure 14:
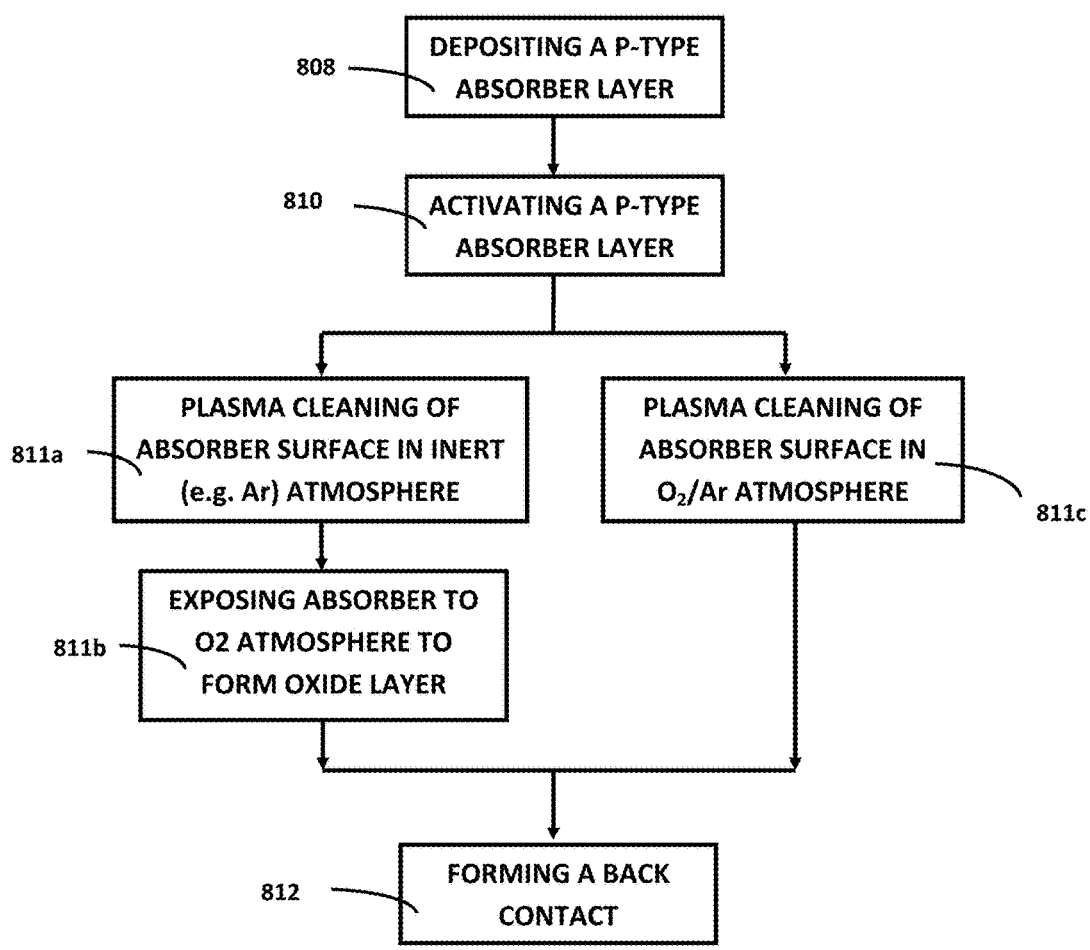
FIG. 14 depicts an expanded version of two variations of the activation step 810 of FIG. 2

FIG. 14 depicts an expanded description of two variations of the cleaning and passivation steps, it being understood that the process steps 802 to 810 that precede, and step 812 that follows, are the same as shown in FIG. 2 and described above. The two process variations are: a two-stage process and a one-stage process. Either of these may be used in addition to or in place of a typical cleaning process. The stages of the two-stage cleaning process are (i) plasma cleaning in an inert atmosphere (step 811*a*) and (2) exposure to oxygen or an oxygen purge (step 811*b*); whereas the single stage of the one-stage cleaning process is a plasma cleaning in an otherwise inert atmosphere that contains oxygen (step 811*c*). Exposure to such an oxygen atmosphere may involve (a) flowing oxygen or $O_2$/inert gas mixtures though the discharge channel of an ALIS device in a purge step, or (b) introduction of the gas into the vacuum chamber in which ALIS plasma cleaning takes place, or (c) both routes.

The plasma cleaning and oxygen exposure steps are believed important to both clean and passivate the absorber surface, thereby allowing the deposition of a more efficient back contact. The ionized plasma cleans the absorber surface of carbon residues, unbonded metal ions, organic compounds, and other contaminants that might be present as a result of deposition, etching or other processes. Depending on the processing steps, the surface layer of a CdTe absorber may be Te-rich, as when a wet clean is used, or Cd-rich, as when the film is thermally annealed. The plasma removes a thin portion (e.g. from about 5 to about 500 angstroms, or from about 10 to about 300 angstroms, or from about 10 to about 200 angstroms) from the surface of the absorber layer to reveal the more stoichiometric composition of the bulk layer. This removes surface crystalline defects and leaves the more stoichiometric layer for better back contact growth, especially when the back contact is deposited immediately afterwards, i.e. without first removing the device from the vacuum chamber or releasing the vacuum. The oxygen exposure also passivates the surface and produces a thin oxide layer as discussed elsewhere.

Methods according to the invention may be applied to any semiconductor layer stack, including without limitation the specific variations described herein. In one embodiment, the one- or two-stage plasma cleaning process is applied to semiconductor layers comprising (including consisting of) cadmium and tellurium, such as CdTe. In one embodiment, the one- or two-stage plasma cleaning process is applied to semiconductor layers comprising (including consisting of) cadmium, selenium, and tellurium, such as $CdSe_xTe_{1-x}$, where x is in the range of about 1 at % to about 40 at %, or alternatively between about 10 at % and about 25 at %. In one embodiment, the one- or two-stage plasma cleaning process is applied to semiconductor layers comprising (including consisting of) cadmium, sulfur, and selenium, such as $CdS_{1-x}Se_x$, where x is in the range of about 1 at % to 25 at %, or alternatively between about 5 at % and about 10 at %. In one embodiment, the one- or two-stage plasma cleaning process is applied to semiconductor layers comprising (including consisting of) cadmium, sulfur, selenium, and tellurium, such as $CdS_xTe_ySe_z$, where $0<x<1$, $0<y<1$, $0<z<1$ at % and $x+y+z=1$.

In general, the back contact is formed on or applied over the oxide layer formed on the semiconductor stack. The composition of the back contact has already been described. In some embodiments, the back contact may be applied directly on and in contact with the oxide layer. In some embodiments, the back contact may be applied to the oxide layer without first removing it from the vacuum of the plasma cleaning chamber. This is referred to herein as applying the back contact "in situ."

Other Embodiment Examples

In one specific example, PV devices are made using either two-stage or a one-stage plasma cleaning process. A measure of efficiency was monitored, deriving from Fill Factor (FF), open circuit voltage ($V_{oc}$) and short-circuit current ($J_{sc}$). In this example, the two stage cleaning/passivation process (811*a*,811*b*) provided about a 2.8% relative improvement in efficiency, and the one-stage cleaning/passivation process (811*c*) provided about a 3.5% relative improvement. The relative % is compared to a control cleaned by a wet chemical etch rather than the LION process. The improved efficiency gained by the plasma cleaning/oxygen passivation process manifests in several ways—namely as an increase in $V_{oc}$, an increase in FF, or a decrease in specific open-circuit resistance ($R_{oc}$), or any combination of these.

In another example, the degree of improvement is evaluated in a one-stage process as a function of the oxygen content in the mixed $O_2$/Ar atmosphere and the consequent thickness of the oxide layer. In this experiment, an oxygen content of about 1% to about 100% may be used, or from about 2% to about 55% about 3% to about 40%. The actual oxide layer thicknesses, as measured by wavelength dispersive x-ray fluorescence (WDXRF), correlated with oxygen content. The higher oxygen atmospheres (e.g. above about 60%) were detrimental to efficiency, presumably due to an oxide layer that was too thick; whereas more modest oxygen contents of 5 to 60% produced thinner oxide layers and a corresponding improvement in efficiency.

Seven-day light soak time profiles showed that higher oxygen levels produced slopes that trended upward or downward over time, indicating instability and changes in the measured parameter. In contrast, the lower levels of oxygen produced more stable products, the lines trending more flat over time, indicating not only better starting points, but less variability.

The PV devices according to the invention also exhibit improved longer term stability compared to PV devices not plasma cleaned and oxygen passivated as described above. PV devices were subjected to light soak (LS) treatments for 3 weeks and the stability index (STBi) was determined. STBi is the percent change in efficiency over LS time relative to the peak efficiency). Thus, it is calculated for each Nth day as [Efficiency (at day N)−peak Efficiency]/peak Efficiency×100. The experiment measured peak efficiencies for a control PV device not treated with a plasma cleaning and oxygen passivation, and an experimental PV device treated in a one-stage plasma cleaning/passivation process with a modest level of oxygen in an $O_2$/Ar atmosphere. Peak efficiency of the experimental device is slightly better than control initially, but after 21 days is a whole percentage point better. The STBi of the plasma cleaned/passivated PV device was more than 2.5 percentage points better than control at 7 days, and more than 4 percentage points better at 21 days.

Without wishing to be bound by any theory, applicants believe the improved efficiency shown by the plasma cleaning and oxygen passivation process described above—and the resulting thin oxide layer—may be attributable to one or more of the following theories. First, the oxide layer may provide a barrier to diffusion of copper (Cu) or other dopant into the absorber layer from the back contact or processes for depositing the back contact. The improved stability testing supports this theory. Additional support comes from a Time-of-Flight Secondary Ion Mass Spectrometry (TOFSIMS) analysis of Cu within the PV devices, which shows a slightly lower Cu concentration in the LION+$O_2$/Ar device at day zero, but a significantly lower concentration after 9 days of LS treatment. In like fashion, the ratio of Cu/Se at the front contact junction after 9 days of LS treatment is lower in the LION+$O_2$/Ar device than in the control device without the LION cleaning process.

It is also believed that the ALIS cleaning process, compared to a traditional wet chemical etch, is more effective at removing carbon residues and contaminants from the semiconductor surface. D-SIMS data confirms that a 60% reduction in carbon level at the interface was obtained compared to a wet clean process. In the case of CdTe absorbers, the cleaning/passivation process also repairs defects and leaves a stoichiometric CdTe surface that is better able to support epitaxial growth of—and ohmic contact with—a subsequent back contact layer. This stoichiometry has been confirmed by XPS methods.

Secondly, the oxide layer may be thin enough to provide a tunneling layer between the absorber and the back contact. Such a tunneling layer should result in less recombination of electrons and holes in the region of the back contact, which should result in a higher $V_{oc}$. The data mentioned above showing an increased $V_{oc}$ support this theory. WDXRF data mentioned above confirm that thin oxide layers were obtained. For example, from about 2 Å to about 100 Å, or from about 3 Å to about 50 Å, or from about 5 Å to about 30 Å. And D-SIMS data confirms the presence of oxygen at the back contact interface in an amount that is an order of magnitude higher than the wet-cleaned control.

Third, the oxide layer may provide passivation of the absorber surface. Any one or a combination of two or more of these proposed mechanisms may provide an explanation of the improved results observed. In other words, the thin oxide layer may provide passivation and a tunneling layer; or a dopant barrier and passivation; or a dopant barrier and tunneling; or all three.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A process for manufacturing a photovoltaic device having a front contact layer stack and a semiconductorer stack, the process comprising:
    plasma cleaning an exposed surface of the semiconductor stack by exposing it to a plasma of ionized gases, wherein the plasma cleaning step removes from about 5 to about 500 angstroms at the surface of the exposed surface;
    exposing the exposed surface of the semiconductor stack to an atmosphere that contains from about 1% to about 60% oxygen in an otherwise inert atmosphere to form an oxide layer on the exposed surface; and
    forming a back contact layer stack on the oxide layer.

2. The process of claim 1 wherein the plasma cleaning and exposing steps are performed sequentially in a two-stage process.

3. The process of claim 1 wherein the plasma cleaning and exposing steps are performed simultaneously in a one-stage process.

4. The process of claim 3 wherein the one-stage process further comprises exposing the exposed surface of the semiconductor stack to a plasma emitted from a discharge channel of an anode layer ion source instrument; wherein the plasma is generated by flowing an ionizable gas through the discharge channel in the presence of crossed magnetic and electric fields to become ionized, the ionizable gas comprising from about 1% to about 60% oxygen in an otherwise inert gas, thereby forming the oxide layer on the exposed surface, prior to forming the back contact layer.

5. The process of claim 4 wherein the inert gas is selected from neon and argon.

6. The process of claim 1 wherein the plasma cleaning step is performed between about 25° C. and about 400° C.

7. The process of claim 1 wherein the exposing step is performed between about 25° C. and about 400° C.

8. A process for manufacturing a photovoltaic device having a front contact layer stack and a semiconductor stack, the process comprising:
    plasma cleaning an exposed surface of the semiconductor stack by exposing it to a plasma of ionized gases;
    exposing the exposed surface of the semiconductor stack to an atmosphere that contains from about 1% to about 60% oxygen in an otherwise inert atmosphere to form an oxide layer on the exposed surface, wherein the plasma cleaning step is performed in a linear anode layer ion source (ALIS) instrument having an ion discharge channel, and wherein the exposing step is performed by flowing oxygen through the ion discharge channel; and
    forming a back contact layer stack on the oxide layer.

9. The process of claim 1 wherein the oxide layer serves as a barrier layer to a dopant or as a tunneling layer or as a passivation layer, or a combination of these.

10. The process of claim 1 wherein the plasma cleaning step is performed under vacuum and wherein the back contact layer stack is formed on the oxide layer in situ without removal from the vacuum.

11. The process of claim 1, wherein the oxide layer is about 2 Å to about 50 Å thick.

12. The process of claim 11, wherein the back contact layer stack is formed on the oxide layer in situ.

13. The process of claim 1, wherein the semiconductor stack comprises an absorber layer, and wherein the plasma cleaning step removes carbon residues and contaminants from a surface of the absorber layer.

14. The process of claim 13 wherein the plasma cleaning step exposes a bulk portion of the absorber layer that is stoichiometric.

15. The process of claim 1, wherein the semiconductor stack comprises an absorber layer, and wherein the plasma cleaning step removes defects in a surface of the absorber layer.

16. The process of claim 15 wherein the plasma cleaning step exposes a bulk portion of the absorber layer that is stoichiometric.

17. The process of claim 1 wherein the plasma cleaning and exposing steps are performed simultaneously in a one-stage process, and wherein the atmosphere contains from about 3% to about 40% oxygen by volume.

18. The process of claim 1 wherein the plasma cleaning step is performed for a duration between about 0.2 minutes to about 10 minutes.

19. The process of claim 1, wherein the oxide layer is about 2 Å to about 30 Å thick.

20. The process of claim 1, wherein the wherein the back contact layer comprises zinc and tellurium.

21. The process of claim 1, wherein the wherein the semiconductor stack comprises cadmium and tellurium and at least one of sulfur, selenium, and zinc.

22. The process of claim 8, wherein the plasma cleaning and exposing steps are performed simultaneously in a one-stage process, and wherein the atmosphere contains from about 2% to about 55% oxygen by volume.

23. The process of claim 8, wherein the plasma cleaning step removes from about 5 to about 500 angstroms at the surface of the exposed surface.

* * * * *